(12) United States Patent
Zhang et al.

(10) Patent No.: US 10,324,256 B2
(45) Date of Patent: Jun. 18, 2019

(54) METHOD OF FORMING AN INTEGRATED CIRCUIT AND RELATED INTEGRATED CIRCUIT

(71) Applicants: Massachusetts Institute of Technology, Cambridge, MA (US); National University of Singapore, Singapore (SG); Nanyang Technological University, Singapore (SG)

(72) Inventors: Wenjia Zhang, Shanghai (CN); Bing Wang, Singapore (SG); Li Zhang, Singapore (SG); Zhaomin Zhu, Singapore (SG); Jurgen Michel, Cambridge, MA (US); Soo-Jin Chua, Singapore (SG); Li-Shiuan Peh, Singapore (SG); Siau Ben Chiah, Singapore (SG); Eng Kian Kenneth Lee, Singapore (SG)

(73) Assignees: Massachusetts Institute of Technology, Cambridge, MA (US); National University of Singapore, Singapore (SG); Nanyang Technological University, Singapore (SG)

( * ) Notice: Subject to any disclaimer, the term of this patent is extended or adjusted under 35 U.S.C. 154(b) by 0 days.

(21) Appl. No.: 15/837,173

(22) Filed: Dec. 11, 2017

(65) Prior Publication Data
US 2018/0172903 A1    Jun. 21, 2018

Related U.S. Application Data

(62) Division of application No. 15/111,418, filed as application No. PCT/SG2015/000011 on Jan. 14, 2015, now Pat. No. 9,874,689.

(Continued)

(51) Int. Cl.
*G02B 6/12* (2006.01)
*H01L 27/15* (2006.01)
(Continued)

(52) U.S. Cl.
CPC .......... *G02B 6/12004* (2013.01); *G02B 6/00* (2013.01); *G02B 6/12* (2013.01); *G02B 6/428* (2013.01);
(Continued)

(58) Field of Classification Search
CPC ..... H01L 2924/00; G02B 6/43; G02B 6/4214; G02B 6/42; G02B 6/12
See application file for complete search history.

(56) References Cited

U.S. PATENT DOCUMENTS 7,082,247 B1 *   7/2006   Gunn, III ........... G02B 6/12004
                                                   385/129
7,095,058 B2    8/2006   Gardner
(Continued)

FOREIGN PATENT DOCUMENTS

CN    1738023 A    2/2006
EP    1130647 A2   9/2001
(Continued)

OTHER PUBLICATIONS

International Search Report for Application No. PCT/SG2015/000011 dated Apr. 21, 2015.
(Continued)

*Primary Examiner* — Jennifer Doan
(74) *Attorney, Agent, or Firm* — Lerner, David, Littenberg, Krumholz & Mentlik, LLP

(57) ABSTRACT

A method of forming an integrated circuit is disclosed. The method includes: (i) forming at least a pair of optoelectronic devices from at least a first wafer material arranged on a semiconductor substrate, the first wafer material different to
(Continued)

silicon; (ii) etching the first wafer material to form a first recess to be filled with a second material; (iii) processing the second material to form a waveguide for coupling the pair of optoelectronic devices to define an optical interconnect; and (iv) bonding at least one partially processed CMOS device layer having at least one transistor to the second semiconductor substrate to form the integrated circuit, the partially processed CMOS device layer arranged adjacent to the optical interconnect. An integrated circuit is also disclosed.

8 Claims, 15 Drawing Sheets

Related U.S. Application Data

(60) Provisional application No. 61/964,776, filed on Jan. 14, 2014.

(51) Int. Cl.

| | | |
|---|---|---|
| *H01L 31/12* | (2006.01) | |
| *H01L 21/8258* | (2006.01) | |
| *H01L 27/06* | (2006.01) | |
| *G02B 6/42* | (2006.01) | |
| *H01L 31/0304* | (2006.01) | |
| *H01L 31/0352* | (2006.01) | |
| *H01L 31/0392* | (2006.01) | |
| *H01L 31/153* | (2006.01) | |
| *H01L 33/06* | (2010.01) | |
| *H01L 33/12* | (2010.01) | |
| *H01L 33/32* | (2010.01) | |
| *G02B 6/00* | (2006.01) | |
| *H01L 31/0232* | (2014.01) | |
| *H01L 31/105* | (2006.01) | |
| *H01L 33/00* | (2010.01) | |

(52) U.S. Cl.
CPC ...... *H01L 21/8258* (2013.01); *H01L 27/0688* (2013.01); *H01L 27/15* (2013.01); *H01L 31/02327* (2013.01); *H01L 31/03044* (2013.01); *H01L 31/03048* (2013.01); *H01L 31/0392* (2013.01); *H01L 31/035236* (2013.01); *H01L 31/035281* (2013.01); *H01L 31/105* (2013.01); *H01L 31/12* (2013.01); *H01L 31/125* (2013.01); *H01L 31/153* (2013.01); *H01L 33/06* (2013.01); *H01L 33/12* (2013.01); *H01L 33/32* (2013.01); *G02B 2006/121* (2013.01); *H01L 33/0079* (2013.01); *Y02E 10/544* (2013.01)

(56) References Cited

U.S. PATENT DOCUMENTS

| | | | |
|---|---|---|---|
| 8,168,939 B2 | 5/2012 | Mack et al. | |
| 8,260,098 B1 | 9/2012 | Golubovic et al. | |
| 8,682,129 B2 | 3/2014 | Sandhu et al. | |
| 8,718,480 B2 | 5/2014 | Snyman | |
| 9,778,416 B2 * | 10/2017 | Meade | G02B 6/1228 |
| 2002/0027293 A1 | 3/2002 | Hoshino | |
| 2003/0026517 A1 | 2/2003 | Shimoda | |
| 2006/0033110 A1 | 2/2006 | Alam et al. | |
| 2007/0105256 A1 | 5/2007 | Fitzgerald | |

FOREIGN PATENT DOCUMENTS

| | | |
|---|---|---|
| JP | 59129481 | 7/1984 |
| JP | 936413 | 2/1997 |
| JP | 2000-82807 A | 3/2000 |
| WO | 2013090140 A1 | 6/2013 |

OTHER PUBLICATIONS

Chung et al., Seamless On-Wafer Integration of Si(100) MOSFETs and GaN HEMTs, IEEE Electron Device Letters, vol. 30, No. 10, Oct. 2009, pp. 1015-1017.

C. Sun, et al., "DSENT—A Tool Connecting Emerging Photonics with Electronics for Opto-Electronic Networks-on-Chip Modeling," in 6th International Symposium on Networks-on-Chip (NOCS), Lyngby, Denmark, May 2012, 10 pages.

A. Shacham, K. Bergman, and L.P. Carloni, "Photonic networks-on-chip for future generations of chip multiprocessors", IEEE Transactions on Computers, vol. 57, No. 9, pp. 1246-1260, Sep. 2008.

D. Miller, "Device requirements for optical interconnects to silicon chips", Proceedings of the IEEE, vol. 97, No. 7, pp. 1166-1185, Jul. 2009.

S. Nakamura, "III-V Nitride Based Light-Emitting Devices", Solid State Communications, vol. 102, No. 2-3, pp. 237-248, 1997.

S.X. Jin, J. Shakya, J.Y. Lin, and H.X. Jiang, "Size dependence of III-Nitride microdisk light-emitting diode characteristics", Applied Physics Letters, vol. 78, No. 22, pp. 3532-3534, May 2001.

Y.D. Jhou, et al., "Nitride-based light emitting diode and photodetector dual function devices with InGaN/GaN multiple quantum well structures.", Solid-State Electronics 49 (2005), pp. 1347-1351, 2005.

T. Krishna, et al., "Breaking the On-Chip Latency Barrier Using SMART", In Proceedings of the 19th International Symposium on High-Performance Computer Architecture (HPCA), Shenzhen, China, Feb. 2013, 12 pages.

D. Fattal, et al., "Design of an efficient light-emitting diode with 10GHz modulation bandwidth", Applied Physics Letters, 93, 243501, 2008, 4 pages.

Wang et al., "On-chip optical interconnects using ingan light-emitting diodes integrated with Si-CMOS", In Asia Communications and Photonics Conference (pp. AW4A-2), Optical Society of America, Nov. 2014.

Chinese Office Action dated Jan. 21, 2019 in Chinese counterpart application No. 2015800117094 (p. 6 categorizing the cited references.).

* cited by examiner

800

| Layer | Composition | Doping (cm$^{-3}$) | Thickness (nm) |
|---|---|---|---|
| PD n | GaN | ~1×10$^{18}$ | 100 |
| PD i | InGaN | ~1×10$^{16}$ | 50 |
| LED p++ | GaN | ~1×10$^{18}$ | 50 |
| LED p | GaN | ~6×10$^{17}$ | 100 |
| LED p | AlGaN | ~6×10$^{17}$ | 10 |
| 5×MQW | InGaN/GaN | - | 5×(2.7+15) |
| Barrier | GaN | - | 15 |
| LED-n | GaN | ~7×10$^{17}$ | 150 |
| LED-n | GaN | ~5×10$^{18}$ | 2400 |
| Buffer | AlN/graded AlGaN | - | 1000 |
| Substrate | Si(111) | - | - |

900
950
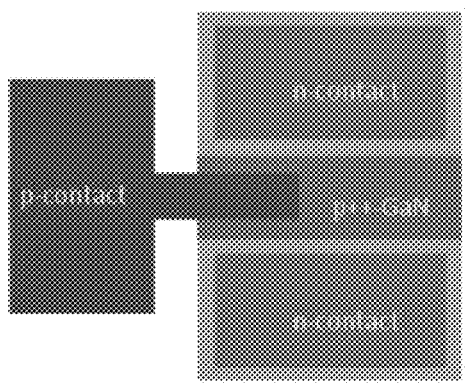
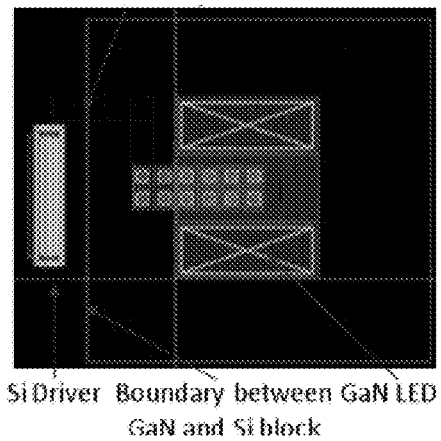
Si Driver   Boundary between   GaN LED
            GaN and Si block
FIG. 9A                    FIG. 9B

1000

| Component | Minimum size (μm) | Component between | Minimum spacing (μm) |
|---|---|---|---|
| bondpad | 2 | p-contact and bondpad | 1 |
| p-contact | 10 | bondpad and active emitting area | 1 |
| n-contact | 16 | active emitting area and n-contact | 1 |
| active emitting area | 12 | active emitting area and n-mesa | 1 |
| n-mesa | 18 | n-contact and n-mesa | 1 |
|  |  | Device to device | 10 |

Legend: AA – SSR, BB – Link, CC – Crossbar, DD – Switch Allocation, EE – Buffer, and FF – Clock.

1400

| Component | Minimum size (μm) | Component between | Minimum spacing (μm) |
|---|---|---|---|
| bondpad | 0.2 | p-contact and bondpad | 0.1 |
| p-contact | 0.2 | bondpad and active emitting area | 0.1 |
| n-contact | 0.2 | active emitting area and n-contact | 0.1 |
| active emitting area | 0.2 | active emitting area and n-mesa | 0.1 |
| n-mesa | 0.2 | n-contact and n-mesa | 0.1 |
| | | Device to device | 0.2 |

FIG. 14

METHOD OF FORMING AN INTEGRATED CIRCUIT AND RELATED INTEGRATED CIRCUIT

CROSS-REFERENCE TO RELATED APPLICATIONS

The present application is a divisional of U.S. patent application Ser. No. 15/111,418, filed on Jul. 13, 2016 which is a national phase entry under 35 U.S.C. § 371 of International Application No. PCT/SG2015/000011, filed Jan. 14, 2015, published in English, which claims priority from U.S. Provisional Patent Application No. 61/964,776, filed Jan. 14, 2014, the disclosures of which are incorporated by reference herein.

FIELD & BACKGROUND

The present invention relates to a method of forming an integrated circuit and related integrated circuit.

In recent years, the semiconductor industry has been boosting performance of processors by increasing the number of cores in processors (i.e. multi-core processors), based on Moore's law which states that the number of transistors in integrated circuits doubles approximately every two years. Incidentally, this brings challenges to designing a power efficient on-die communication backbone, e.g. a Network-on-Chip (NoC), for delivery of data-bits between the cores and associated memories. It will be appreciated that electrical (metal-based) interconnects have traditionally dominated on-chip communications in modern processors, and insofar satisfy the communication requirements of conventional multi-core processors. However, as a number of cores increases, a power budget allocated to the corresponding multi-core processor then becomes increasingly constrained, not to mention that performance of the processor will also be severely limited due to usage of electrical interconnects, which undesirably suffer from an inherent bandwidth-distance-power trade-off.

New types of interconnects are needed to enable higher scalability for future multi-core processors. Based on literature, optical interconnects are considered to have the potential to overcome the mentioned bandwidth-distance-power trade-off of electrical interconnects. An optical/photonic interconnect generally comprises a light emitting source for generating an information carrier, a modulator for Electrical/Optical (E/O) data transformation, a photodiode for light detection, miscellaneous passive components for light guiding, and peripheral electronic devices for driving and biasing photonic devices. For an optical interconnect, the light emitting source is generally the most important device as it consumes a substantial fraction of the total link power expended. In this respect, existing solutions tend to utilize off-chip lasers as the light emitting source, which however consume a significant amount of power due to their high threshold current. Even when the optical interconnects are used sporadically, power consumption of the lasers remains largely constant because communication data is modulated externally atop of the continuous wavelengths of the lasers, thus resulting in high power consumption by the lasers regardless of an actual amount of data transmission through the optical interconnects.

One object of the present invention is therefore to address at least one of the problems of the prior art and/or to provide a choice that is useful in the art.

SUMMARY

According to a 1$^{st}$ aspect of the invention, there is provided a method of forming an integrated circuit, comprising:

(i) forming at least a pair of optoelectronic devices from at least a first wafer material arranged on a semiconductor substrate, the first wafer material different to silicon; (ii) etching the first wafer material to form a first recess to be filled with a second material; (iii) processing the second material to form a waveguide for coupling the pair of optoelectronic devices to define an optical interconnect; and (iv) bonding at least one partially processed CMOS device layer having at least one transistor to the second semiconductor substrate to form the integrated circuit, the partially processed CMOS device layer arranged adjacent to the optical interconnect.

The proposed method advantageously adopts a monolithic integrated process for bonding an III-V substrate and a silicon substrate, which is directly compatible with conventional CMOS processing, and hence does not require costly and complex reconfiguration of existing CMOS manufacturing techniques to realise the method for obtaining the integrated circuit.

Preferably, the first wafer material different to silicon may include a group III-V semiconductor material or an organic material.

Preferably, the group III-V semiconductor material may include GaN, InGaP, GaAs, AlGaAs or InGaAs.

Preferably, the second material may include silicon nitride.

Preferably, wherein bonding the partially processed CMOS device layer to the semiconductor substrate may include processing the partially processed CMOS device layer to provide a second recess permitting access to the optical interconnect and filling the second recess with an electrically insulating material; and processing the electrically insulating material to electrically connect the at least one transistor and the pair of optoelectronic devices to form the integrated circuit.

Preferably, the electrically insulating material may include silicon dioxide.

Preferably, the optoelectronic devices may be selected from the group consisting of photodetectors and light emitting devices.

Preferably, the light emitting devices may include Light Emitting Diodes (LEDs) or Organic-LEDs.

Preferably, the method may further comprise performing CMOS processing on a further semiconductor substrate to obtain at least the partially processed CMOS device layer having the at least one transistor; and removing the partially processed CMOS device layer from the further semiconductor substrate.

Preferably, the further semiconductor substrate may include a silicon-on-insulator substrate.

Preferably, the method may further comprise depositing an electrically insulating material to cover the first wafer material subsequent to forming the pair of optoelectronic devices; and planarizing the deposited electrically insulating material using Chemical Mechanical Polishing.

Preferably, the method may further comprise planarizing the first recess filled with the second material using Chemical Mechanical Polishing, subsequent to the first recess being filled with the second material.

Preferably, wherein processing the second material to form the waveguide may include using lithography and/or etching.

Preferably, the method may further comprise depositing an electrically insulating material to cover the first wafer material and second material subsequent to forming the waveguide; and planarizing the deposited electrically insulating material using Chemical Mechanical Polishing.

Preferably, wherein processing the partially processed CMOS device layer to provide the second recess may include using etching and/or mechanical grinding.

Preferably, the method may further comprise planarizing the partially processed CMOS device layer and the second recess filled with the electrically insulating material using Chemical Mechanical Polishing.

Preferably, wherein processing the electrically insulating material to electrically connect the at least one transistor and the pair of optoelectronic devices may include forming a plurality of vias in the electrically insulating material and filling the vias with an electrically conducting material.

Preferably, wherein bonding the partially processed CMOS device layer to the semiconductor substrate may include arranging the optical connection below the partially processed CMOS device layer.

Preferably, wherein the at least first wafer material may include a plurality of layers of wafer materials, each layer formed of a different material.

According to a $2^{nd}$ aspect of the invention, there is provided an integrated circuit comprising at least one transistor arranged in a partially processed CMOS device layer; and at least a pair of optoelectronic devices adapted to be coupled by a waveguide to define an optical interconnect on a semiconductor substrate which is arranged adjacent to the partially processed CMOS device layer, wherein the optoelectronic devices are configured to be electrically connected to the transistor, and the optoelectronic devices are formed from at least a first wafer material different to silicon, and wherein the waveguide is formed from a second material deposited in a first recess formed in the first wafer material.

Preferably, the first wafer material different to silicon may include a group III-V semiconductor material or an organic material.

Preferably, the group III-V semiconductor material may include GaN, InGaP, GaAs, AlGaAs or InGaAs.

Preferably, the integrated circuit may be formed as a single processor or a portion of a processor.

Preferably, the optical interconnect may be arranged below the partially processed CMOS device layer.

Preferably, the second material may include silicon nitride.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 6A is an example of an integrated circuit formed using the method of FIG. 1, while

FIGS. 9A and 9B respectively show a mask layout for manufacturing the InGaN LED of FIG. 7, and a PDK design of the InGaN LED of FIG. 7 and an associated Si-driver;

FIG. 11A is a further example of an integrated circuit formed using the method of FIG. 1, while

FIG. 12A shows a SMART micro-architecture according to the prior art, while FIG. 12B shows a variant SMART micro-architecture incorporating an integrated circuit formed using the method of FIG. 1;

FIG. 14 is a table listing various design parameters for the InGaN LED of FIG. 7, according to a variant embodiment.

DETAILED DESCRIPTION OF PREFERRED EMBODIMENTS

Figure 1:
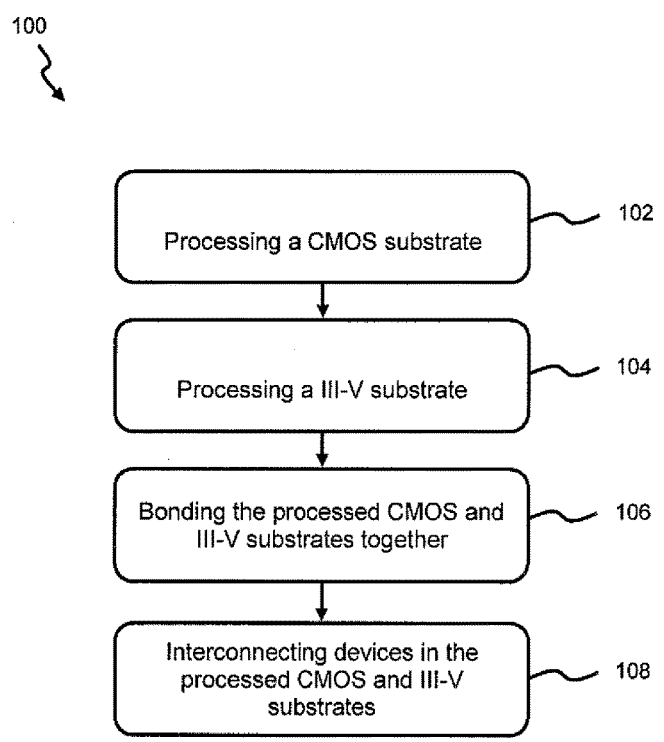
FIG. 1 is a flow diagram relating to a method of forming an integrated circuit, according to an embodiment of the invention.

FIG. 1 is a flow diagram 100 directed at a method of forming an integrated circuit, according to an embodiment. The integrated circuit may be formed as a single processor or as a portion of a processor, but for this embodiment, (as an example) the integrated circuit is taken to be a processor. An overview of the method is set out as follows: at step 102, a Si-CMOS substrate 202 (e.g. a silicon-on-insulator (SOI) substrate) is CMOS processed to form at least one transistor (which is silicon-based), and at step 104, a III-V substrate 302 is processed to form optoelectronics devices (e.g. LEDs, OLEDs, photodetectors and/or the like) thereon. Needlessly to say, the III-V substrate 302 is formed of any suitable III-V materials (e.g. InGaN, or GaN, but not to be construed as limiting). It is highlighted that step 102 is carried out using conventional CMOS processing techniques, and so an in-depth explanation is omitted for brevity sake. Also, the Si-CMOS substrate 202 with at least one transistor may be considered as a partially processed Si-CMOS substrate. The partially processed Si-CMOS substrate may also be termed as a partially processed Si-CMOS device layer). It is to be appreciated that at least one Si-CMOS device layer is needed. But in this case, the at least one transistor includes a plurality of transistors, which may be configured as processors with associated caches, routers, link drivers or the like. Then at step 106, the processed Si-CMOS and III-V substrates 202, 302 are bonded together, and at final step 108, the transistors and optoelectronic devices respectively formed in the processed Si-CMOS and III-V substrates 202, 302 are electrically connected. Hence, it will be appreciated that the integrated circuit is monolithically formed as set out above. Detailed description of each step 102-108 is now further provided below.

As mentioned, the integrated circuit is integrally formed from Si-CMOS and III-V materials. For optoelectronics devices to be made using the GaN material, it is to be appreciated that because GaN needs to be grown on a Si(111) substrate with matched lattice orientation, while Si-CMOS circuits are typically fabricated on a Si(100) substrate, bonding technology is thus required to integrate the transistors and optoelectronics devices on a single wafer. Considering that temperatures typically used for growing GaN is too high (i.e. around 1000° C.) for the transistors to survive, the transistors thus need to be separately fabricated as a front-end substrate through the Si-CMOS substrate, while epitaxy of the optoelectronics devices is performed separately as well, before the processed Si-CMOS and III-V substrates are subsequently bonded together as described in step 106.

Figures 2A, 2B, 2C:
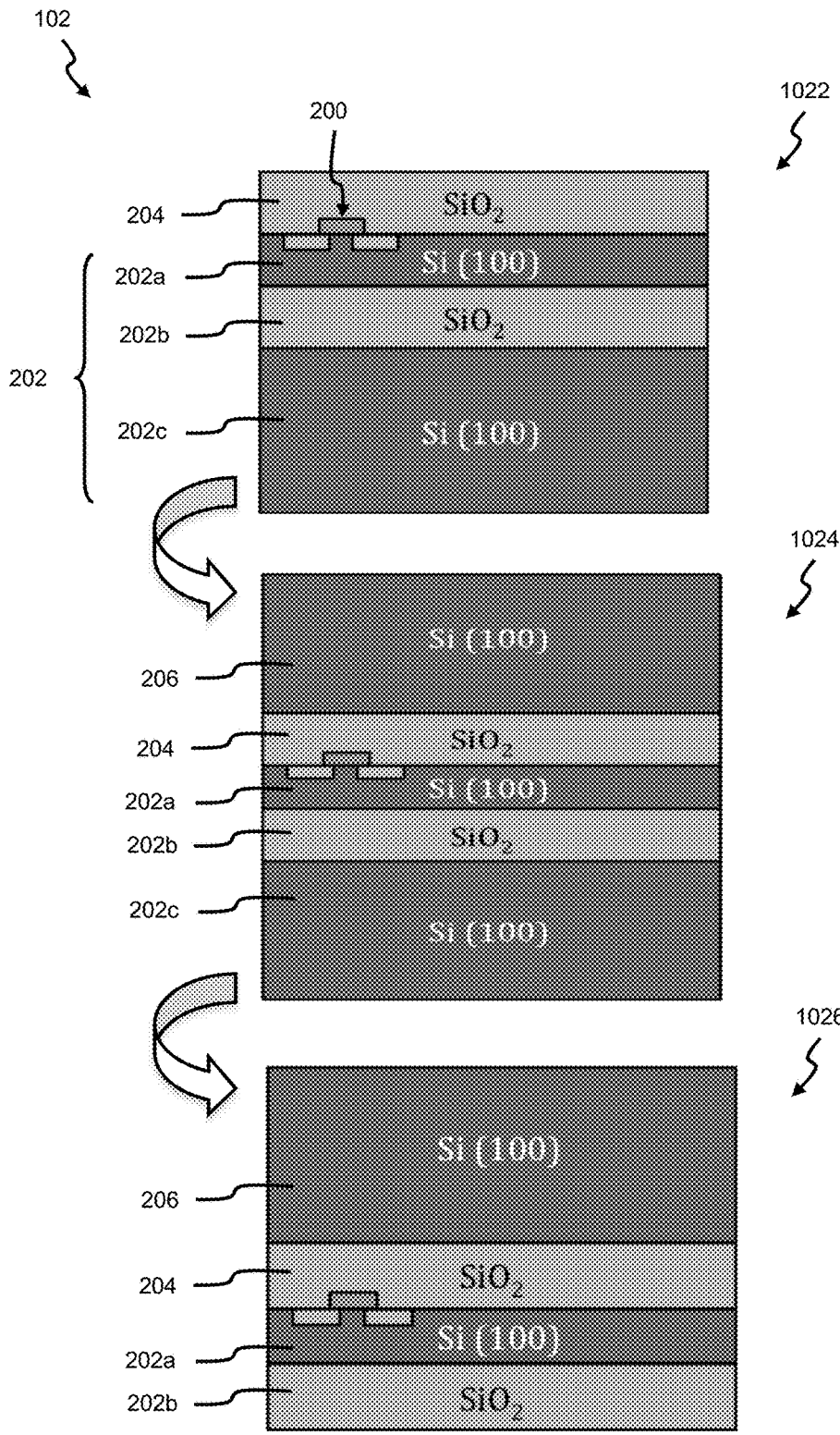
FIGS. 2A-2C are flow diagrams of step 102 of the method of FIG. 1.

FIGS. 2A to 2C collectively depict a flow diagram 102 of sequential steps 1022, 1024, 1026, which form step 102 of the method of FIG. 1. In step 1022 of FIG. 2A, transistors 200 are fabricated using the Si-CMOS substrate 202, which in this case is an SOI substrate (but not to be construed as limiting), and to be referred to as such hereinafter. The SOI substrate 200 includes (in a top down order) a top Si(100) layer 202a, a first $SiO_2$ layer 202b, and a bottom Si(001) layer 202c. For easy referencing, this is termed as the right-side up arrangement of the SOI substrate 200. The transistors 200 are fabricated at the top Si(100) layer 202a, which upon completion is covered by a second $SiO_2$ layer 204. If necessary, planarization of the second $SiO_2$ layer 204 is performed using Chemical Mechanical Polishing (CMP) or other suitable processes. It is to be appreciated that the SOI substrate 200 is still orientated in the right-side up arrangement. In step 1024 of FIG. 2B, the SOI substrate 200 is bonded to a Si handle wafer 206, which is attached adjacent and planar to the second $SiO_2$ layer 204. Next, in step 1026 of FIG. 2C, the bottom Si(001) layer 202c of the SOI substrate 200 is removed substantially, until the first $SiO_2$ layer 202b is exposed. With completion of step 1026 depicted in FIG. 2C, the processed SOI substrate 200 is obtained. The processed SOI substrate 200 may be termed as a processor wafer.

Next, FIGS. 3A to 3D collectively show a flow diagram 104 of sequential steps 1042, 1044, 1046, 1048 forming step 104 of the method of FIG. 1. In step 1042 of FIG. 3A, optoelectronic devices 300 are first fabricated using the III-V substrate 302, which in this case includes (in a top down order) a GaN layer 302a and a Si(111) layer. It is to be appreciated that for sake of easy explanation in this embodiment, the GaN layer 302a is described herein as a single layer, but not to be construed as limiting since in other variant embodiments, the GaN layer 302a may comprise multiple GaN layers or multiple layers formed of other materials (e.g. AlGaN or InGaN), instead of GaN. That is, for ease of description, FIGS. 3A-3D only notionally shows where the GaN material and optoelectronic devices 300 reside in the III-V substrate 302—it is not actually representative of actual LED layers. For easy referencing, this is termed the right-side up arrangement of the III-V substrate 302. The optoelectronics devices 300 fabricated (at the GaN layer 302a) in this instance includes at least one GaN LED and a corresponding photodetector in opposing arrangement. So the optoelectronics devices 300 in this case include at least a pair of optoelectronics devices. As understood, the GaN layer 302a (being a III-V material) is different to silicon. Of course, in certain embodiments, a plurality of such pairs of GaN LED and corresponding photodetector may be formed depending on intended applications. A portion of the GaN layer 302a lying intermediate the GaN LED and corresponding photodetector is then removed via etching to form at least one recess to later accommodate a waveguide 310 for coupling the GaN LED and corresponding photodetector together. The definition of etching includes chemical etching. It is to be appreciated that the GaN LED, corresponding photodetector and the waveguide 310 thus constitutes an LED-based optical interconnect (i.e. an optical connection) of the integrated circuit. In step 1044 of FIG. 3B, a first $SiO_2$ layer 304 is deposited to cover the GaN layer 302a and the at least one recess. If necessary, planarization of the first $SiO_2$ layer 304 is also performed using CMP.

Figure 3A:
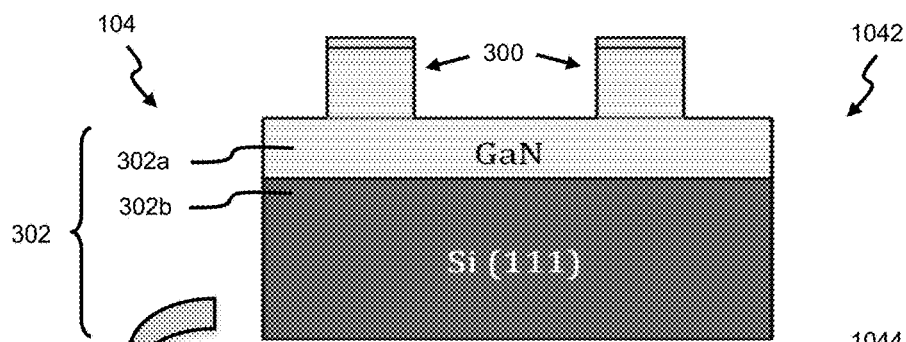
FIGS. 3A-3D are flow diagrams of step 104 of the method of FIG. 1.
Figure 3B:
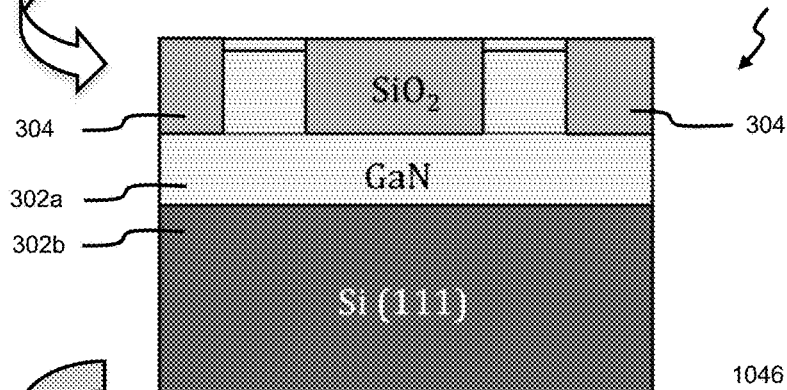
Figure 3C:
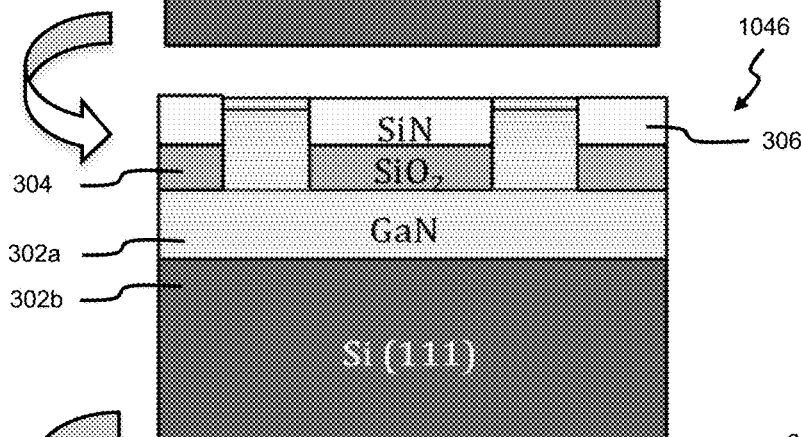
Figure 3D:
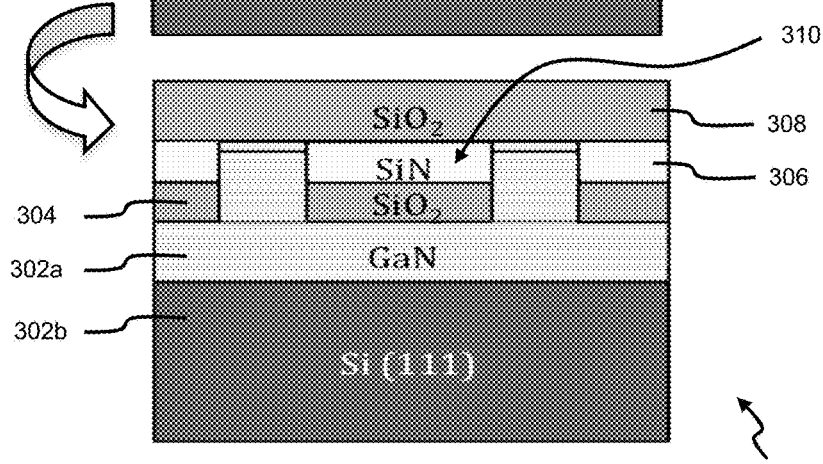

Then as depicted in step 1046 of FIG. 3C, the associated portion of the first $SiO_2$ layer 304 which is deposited in the at least one recess (created at step 1042 of FIG. 3A) is etched again to partially expose another new recess at the same position. Next, a SiN layer 306 (e.g. $Si_3N_4$) to form the waveguide 310 is then deposited into the new recess, which also covers the first $SiO_2$ layer 304. Essentially, the SiN layer 306 fills in the recess created at the step 1046 of FIG. 3C. If necessary, planarization of the SiN layer 306 is performed using CMP. In step 1048 of FIG. 3D, the SiN layer 306 is then processed using lithography and/or etching to form the waveguide 310. The waveguide 310 is adapted to couple the optoelectronics devices 300 to form the LED-based optical interconnect. Thereafter, a second $SiO_2$ layer 308 is deposited to cover and encapsulate the SiN layer 306 (which includes the waveguide 310), and to be followed by performing CMP planarization if required. The processed III-V substrate 302 (still in the right-side up arrangement) is then obtained with completion of step 1048. The processed III-V substrate 302 may be termed as a photonic wafer.

As mentioned, it is to be appreciated that the optoelectronic devices 300 may comprise a plurality of layers of different materials/alloys, as understood in the art. For example, in the case of GaN-based LEDs, the different layers may be binary materials such as GaN, AlN and InN, and ternary or quaternary alloys of InAlGaN. Typically, all the layers are formed in a single epitaxial process run (e.g. also at step 1042 of FIG. 3A), but it is also possible to first form a GaN buffer/template (complete with required AlN and AlGaN buffer layers), and then perform selective-area regrowth to form subsequent layers so as to directly create the device mesas.

Figure 4A:
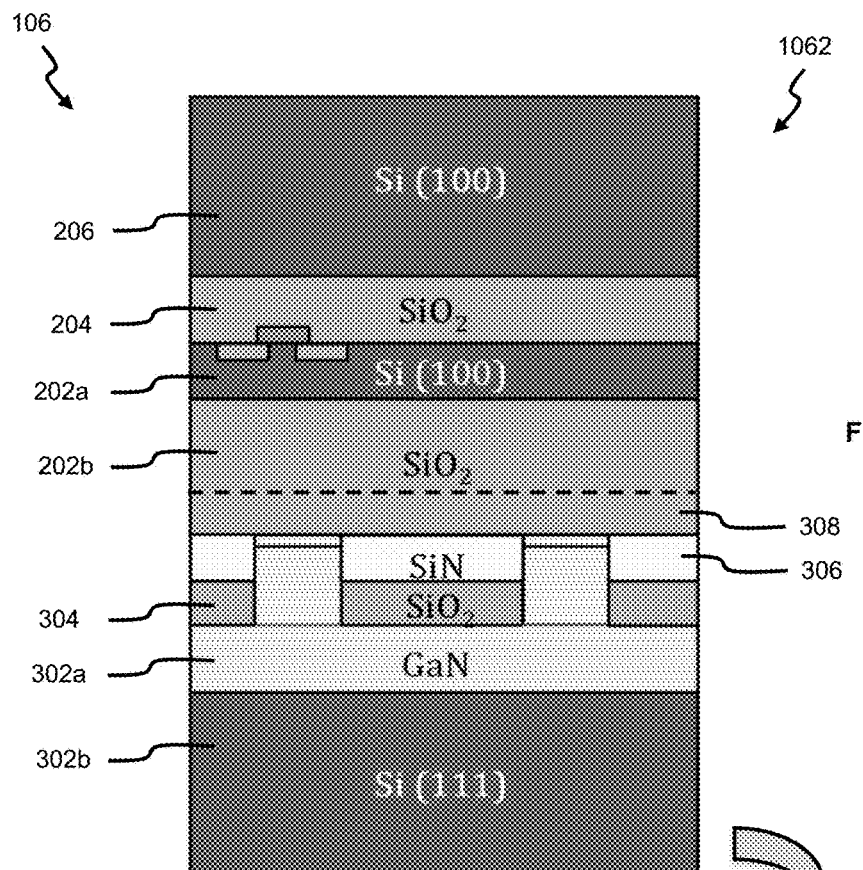
FIGS. 4A and 4B are flow diagrams of step 106 of the method of FIG. 1.
Figure 4B:
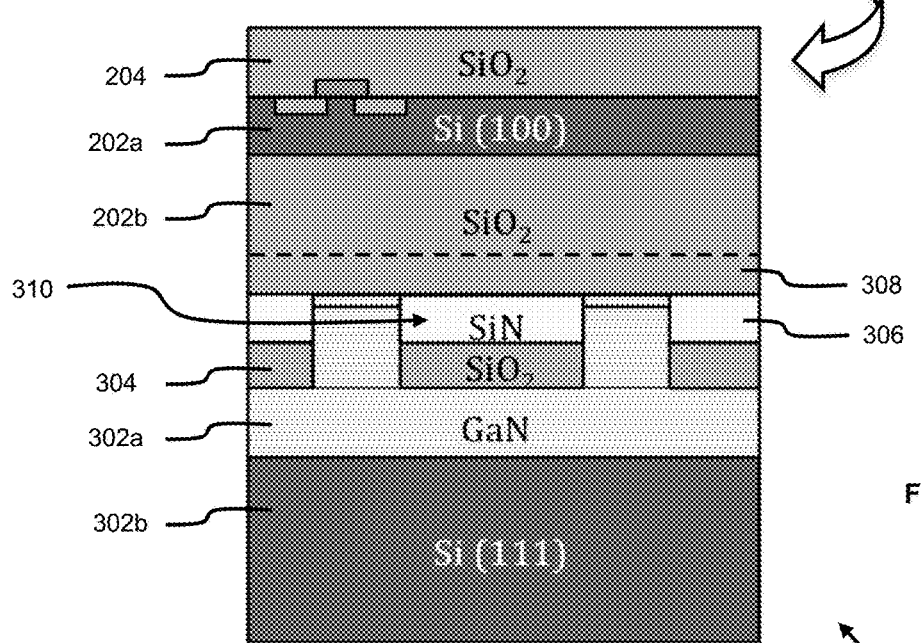
Figures 5A, 5B:
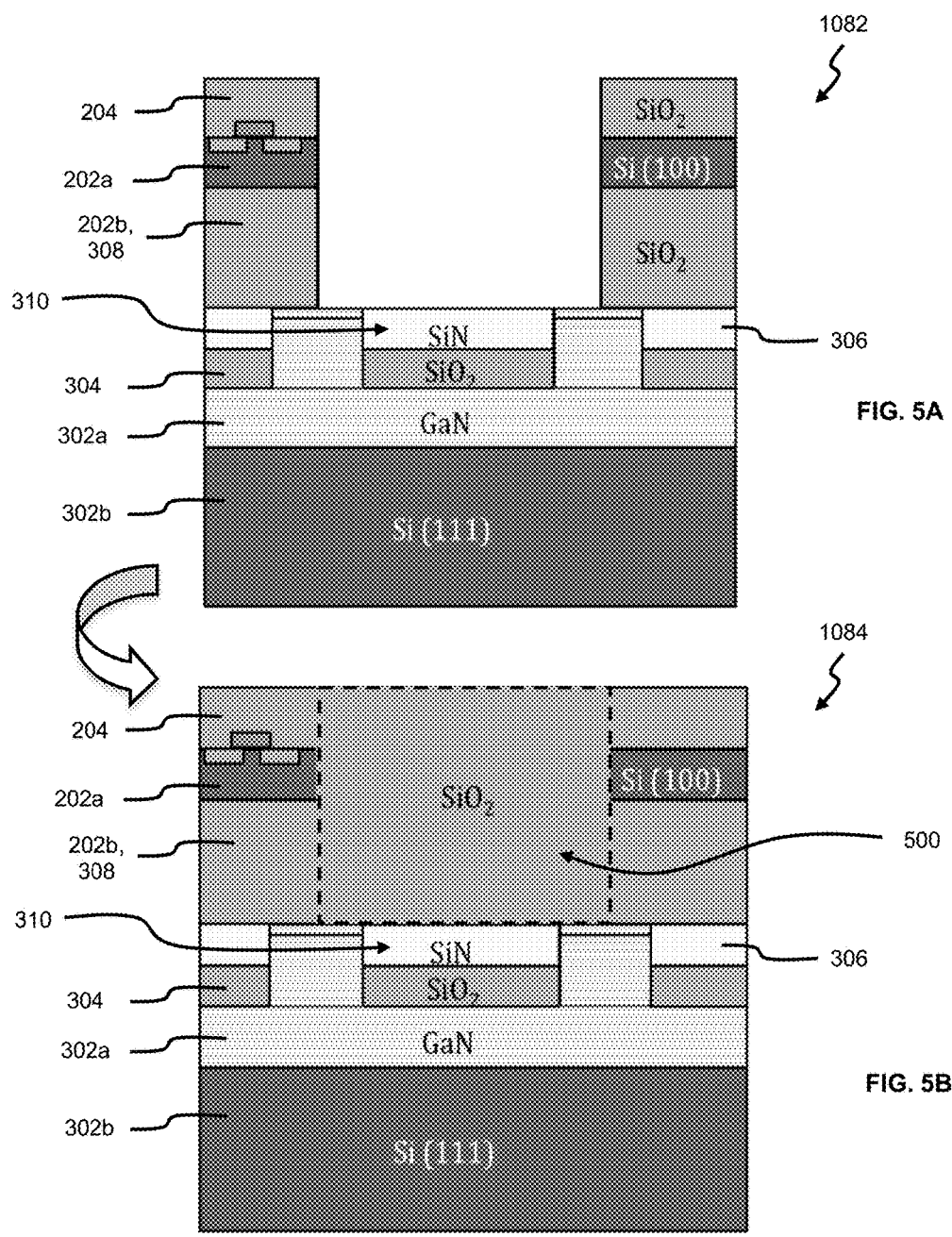
FIGS. 5A-5D are flow diagrams of step 108 of the method of FIG. 1.
Figure 5C:
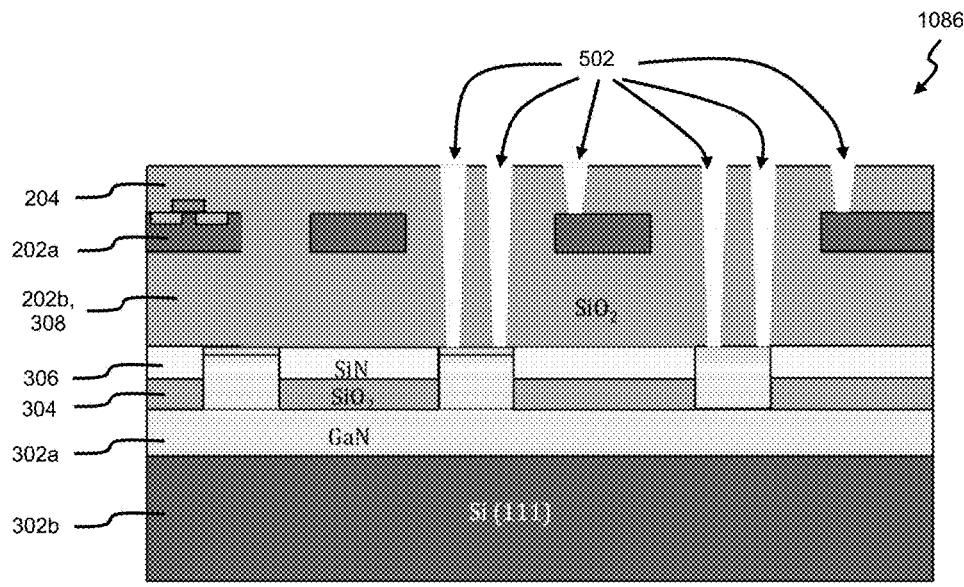
Figure 5D:
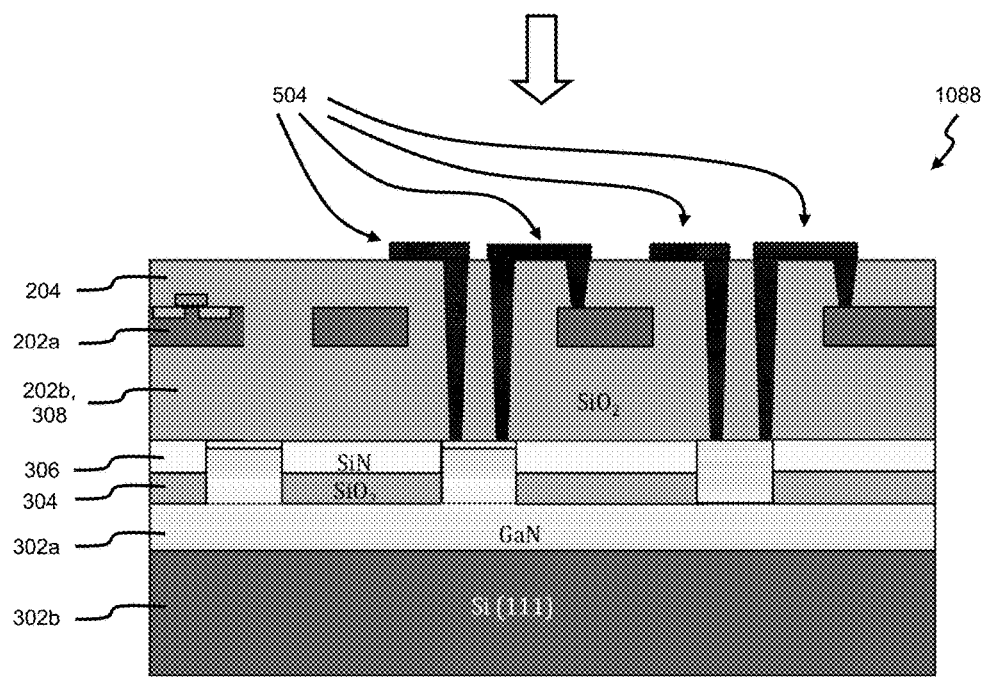

FIGS. 4A and 4B illustrate a flow diagram 106 of sequential steps 1062, 1064 forming step 106 of the method of FIG. 1. In step 1062 of FIG. 4A, the processed SOI substrate 200 (obtained in step 1026 of FIG. 2C) and processed III-V substrate 302 (obtained in step 1048 of FIG. 3D) are aligned accordingly and bonded together. It is to be appreciated that the processed SOI substrate 200 is bonded on top of and adjacent to the processed III-V substrate 302. That is, the first $SiO_2$ layer 202b of the processed SOI substrate 200 is arranged planar and immediately vertically adjacent to the second $SiO_2$ layer 308 of the processed III-V substrate 302. Also, the processed SOI substrate 200 and the processed III-V substrate 302 (when bonded) are located in disjointed planes (i.e. the transistors 200 and optoelectronic devices 300 are positioned in different respective planes). In step 1064 of FIG. 4B, the Si handle wafer 206 of the processed SOI substrate 200 is removed. Specifically, the processed SOI substrate 200 and processed III-V substrate 302 are still in their respective right-side up arrangements. Moreover, it will be appreciated such monolithic integration enables orientation mismatch between the Si(100) layer 202a of the processed SOI substrate 200 and the Si(111) layer 302b of the processed III-V substrate 302 to be avoided.

FIGS. 5A to 5D depict a flow diagram 108 of sequential steps 1082, 1084, 1086, 1088, which collectively form step 108 of the method of FIG. 1. In step 1082 of FIG. 5A, the bonded processed SOI substrate 200 and III-V substrate 302 (obtained from step 1064 of FIG. 4B) undergoes etching/mechanical grinding so that a portion of the processed SOI substrate 200 is removed to form a recess. The amount of the portion of the processed SOI substrate 200 removed is to depends on requirements but it will be appreciated that performing step 1082 is to enable removal of the top Si(100) layer 202a in regions where a plurality of vias 502 are to be formed to allow the transistors 200 and optoelectronics devices 300 to be electrically connected. That is to say, etching/mechanical grinding only needs to be carried out in regions around where the vias 502 are intended to be formed, and the etching/mechanical grinding is then stopped at an appropriate determined position within the first $SiO_2$ layer 202b such that both the SiN layer 306 and GaN layer 302a are consequently still protected by some amount of $SiO_2$. That is, access to the LED-based optical interconnect is permitted through the recess. The purpose of forming the recess at this step 1082 is so to facilitate subsequent electrical connection of the transistors 200 (of the processed SOI substrate 200) to the optoelectronics devices 300 (of the processed III-V substrate 302). In step 1084 of FIG. 5B, the recess is then filled substantially with an electrically insulating material 500 (e.g. $SiO_2$), and followed by CMP planarization if necessary. In step 1086 of FIG. 5C, the plurality of vias 502 is appropriately formed in the electrically insulating material 500, and the respective vias 502 are filled in step 1088 of FIG. 5D with an electrically conducting material 504 (e.g. a suitable metal) to electrically connect the transistors 200 to the optoelectronics devices 300 to obtain the completed integrated circuit. If necessary, planarization of the completed integrated circuit is performed using CMP.

For this embodiment, the method of FIG. 1 is described as being practised by a single entity. But not to be construed as limiting, it is also to be appreciated that for the method of FIG. 1, related steps 102-108 may alternatively be performed separately by different entities if required, such as different CMOS foundries. For example, a first CMOS foundry may perform step 102, while a different non-CMOS foundry entity may then perform step 104. Subsequently, a second CMOS foundry may perform step 106 and then the first CMOS foundry returns to perform step 108. Of course, the different sub-steps of steps 102, 106 and 108 may also be assigned to yet further different CMOS foundries if desired, for example if technically possible and economically viable. Also in such a scenario, step 102 of FIG. 1 may then simply be omitted or be re-defined as receiving an already partially processed Si-CMOS substrate, rather than processing the CMOS substrate. An advantage of the above described variant operations is that prior investments made in CMOS technology by the different CMOS foundries may beneficially be leveraged to enable many of the proposed integrated circuit to be manufactured cheaply on a mass production scale. Of course, such an advantage is also shared by the present embodiment. In other examples, step 106 need not be performed in CMOS foundries because CMOS foundries may alternatively prefer to receive the combined wafer obtained after completion of step 106, so that the CMOS foundries may only need to carry out standard-CMOS processing in step 108.

Figure 6A:
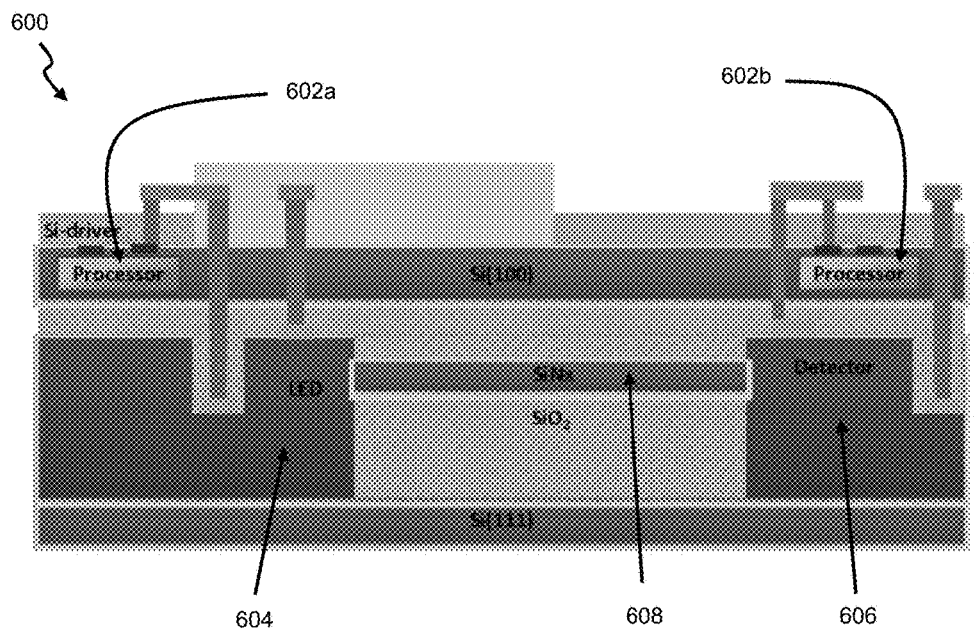
Figure 6B:
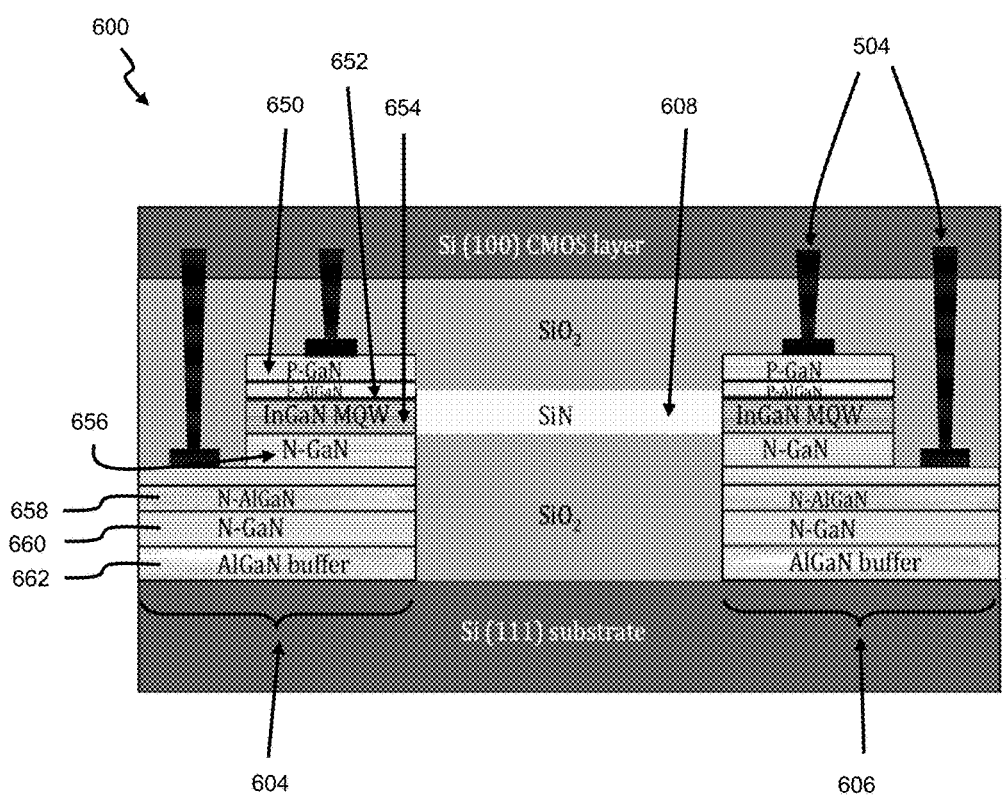
FIG. 6B is a simplified diagram of FIG. 6A showing schematics of respective optoelectronics devices in the integrated circuit.

FIG. 6A is a first example 600 of the integrated circuit formed using the method of FIG. 1, while FIG. 6B is a simplified diagram of FIG. 6A depicting schematics of the optoelectronic devices configured in the integrated circuit of FIG. 6A. For the first example 600, the integrated circuit in FIG. 6A comprises two (first and second) processors 602a, 602b (formed from the transistors 200 of the processed SOI substrate 200), and together with an InGaN LED 604 and a corresponding InGaN photodetector 606 (formed from the optoelectronics devices 300 of the processed III-V substrate 302). A waveguide 608 (made of $SiN_x$) couples the InGaN LED 604 to the InGaN photodetector 606, while the first processor 602a is electrically connected to the InGaN LED 604 for controlling thereof. The second processor 602b is then electrically connected to the InGaN photodetector 606 for controlling thereof. It is to be appreciated that $SiN_x$ has been widely studied as a material for constructing optical waveguides, because $SiN_x$ may easily be integrated with silicon substrates. It is to be appreciated that in this text, SiN and SiNx are used interchangeably to refer to the same dielectric material.

Configured to operate at a wavelength of about 450 nm, the InGaN LED 604 and InGaN photodetector 606 (of the first example 600) are each identically formed with the following layers (described in a top-down order): a p-GaN layer 650, a p-AlGaN layer 652, an InGaN MQW layer 654, a first n-GaN layer 656, an n-AlGaN layer 658, a second n-GaN layer 660, and a AlGaN buffer layer 662. Specifically, it is highlighted that dual-function operations relating to light emission and light detection are possible using just the InGaN MQW layer 654, and hence explains why the InGaN LED 604 and InGaN photodetector 606 are formed similarly. For information, it is to be appreciated that while LEDs with the InGaN/GaN MQWs layers are typically used as solid-state light sources, such LEDs are however typically used only in interior house lightings and there are little literature related to optimizing such LEDs for on-chip communication purposes. It is to be appreciated that key considerations for on-chip communication are high-speed, small-form factor, and high efficiency, which are listed approximately in the order of importance.

Figure 7:
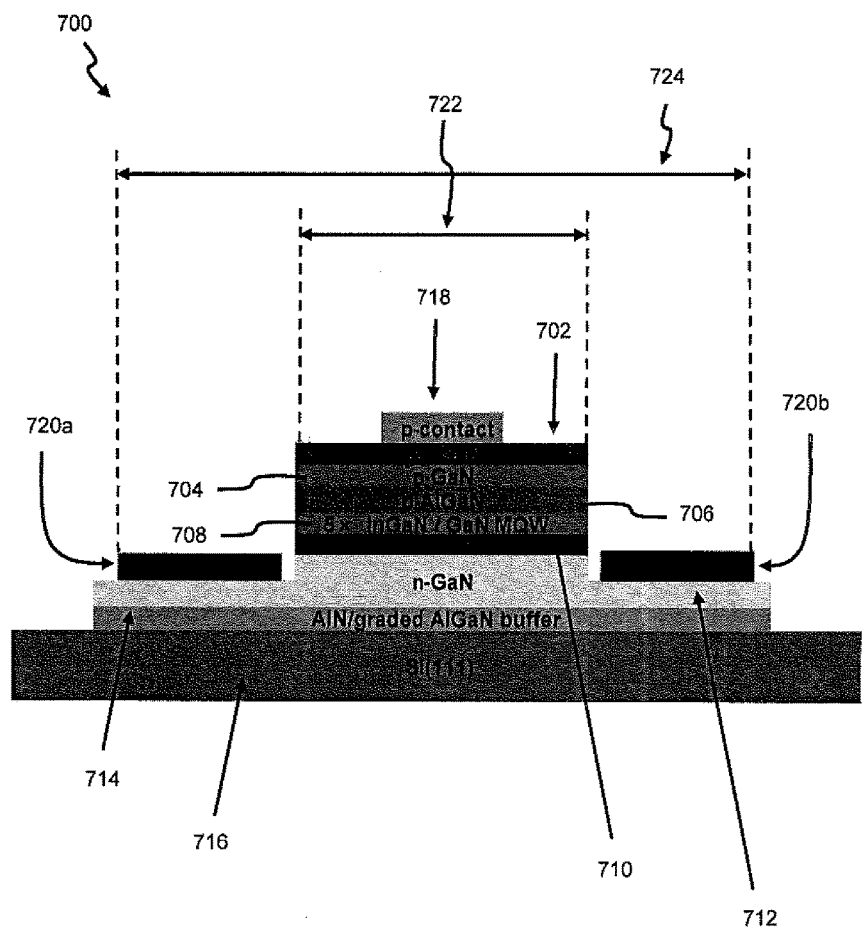
FIG. 7 is a schematic diagram of an InGaN LED that may be arranged in the integrated circuit formed using the method of FIG. 1.
Figure 8:
FIG. 8 is a table listing the respective layers of an epitaxial growth layer structure of the LED of FIG. 7.

FIG. 7 is a schematic diagram of another InGaN LED 700 that may also be formed in the proposed integrated circuit. The different layers of the InGaN LED 700 are formed in a similar manner as afore described in FIG. 3A, and hence description is not repeated for brevity sake. To briefly highlight, various layers are formed to perform specific functions, such as bandgap smoothening, current spreading, optical mode shaping and the like, as will be understood in the art. Particularly, the InGaN LED 700 is formed to include the following layers (in a top-down order): a $p^{++}$-GaN layer 702, a p-GaN layer 704, a p-AlGaN layer 706, five InGaN/GaN MQWs 708, a first n-GaN layer 710, a second n-GaN layer 712, a AlN/graded AlGaN buffer layer 714, and a Si(111) layer 716 functioning as a base substrate. The $p^{++}$-GaN layer 702, p-GaN layer 704, p-AlGaN layer 706, and five InGaN/GaN MQWs 708 collectively form an active light emitting area. A p-contact layer 718 is formed adjacent to the $p^{++}$-GaN layer 702, while two n-contact layers 720a, 720b are formed adjacent to the second n-GaN layer 712 to facilitate control of the InGaN LED 700. An (outermost) edge-to-edge distance between the two n-contact layers 720a, 720b is defined as the n-mesa 724. It is to be appreciated that all the layers 702-720 as depicted in FIG. 7 are deposited via epitaxy, after which device fabrication of the InGaN LED 700 then commences. FIG. 8 is a table 800 listing relevant parameters of the respective layers of an epitaxial growth layer structure of a InGaN/GaN photodetector 1104 of FIG. 11A, which is to be elaborated below later. It is to be appreciated that the InGaN LED 700, which is configured with micro-dimensions, may find applications in high-speed communications due to micro-size effects of the InGaN LED 700, as well as enable more efficient usage of injected current.

For FIG. 6B, it is highlighted that a single contiguous n-contact which may also be arranged to surround all four-sides of the p-mesa (i.e. collectively the p-GaN layer 650, p-AlGaN layer 652, InGaN MQW layer 654, and first n-GaN layer 656), but for this present embodiment, the n-contact formed is restricted to only three sides in order to free up space for forming the waveguide 608. But for other envisaged embodiments, the waveguide 608 may be arranged to extend in both directions, i.e. to the left side of the InGaN LED 604, and in that case the n-contact will be limited to at most two sides of the p-mesa. So FIG. 6B and FIG. 7 as presented may be viewed as being two different orthogonal cuts of a device with the n-contact arranged to surround three sides of the p-mesa.

Further, it is to be appreciated that the definition of "micro-size effects" in this case refers to differences in behaviour between very small and large devices, most specifically relating to speed, and L-I-V (i.e. Light output power-current-voltage) behaviour. On the other hand, the definition of "injected current" refers to the current used to drive the device—essentially, for a given injected current, more light is generated for a smaller device on a proportional basis, when compared with larger devices, hence the difference in the L-I-V behaviour.

Based on the method 100 of FIG. 1, FIGS. 9A and 9B respectively show a mask layout 900 adapted for manufacturing the InGaN LED 700 of FIG. 7, and a PDK design 950 for the InGaN LED 700 of FIG. 7 and an associated transistor (which is configured as a Si-driver in this case) to drive the InGaN LED 700. It is to be appreciated that for targeting the 0.25 μm technology node layout design rules (used for the mask layout 900) to permit DRC and LVS check similar to for conventional electrical VLSI design are adopted. It is to be appreciated that in the case of an optical interconnect comprising of an LED, a waveguide and a photodetector, there is no transistor and therefore no "gate" is present. However, the "0.25 μm technology node" definition still applies in the sense that a smallest feature (e.g. the width of the LED, waveguide and/or photodetector) may be 0.25 μm based on the proposed method. Because the same fabrication tools and design rules are used for making any related RF circuits, the smallest feature size in the said RF circuits (e.g. the gate lengths) is also limited to 0.25 μm.

Figure 10:
FIG. 10 is a table listing various design parameters for the InGaN LED of FIG. 7.

Accordingly, FIG. 10 is a table 1000 listing various example design parameters for components of the InGaN LED 700, particularly showing a minimum size of each component of the InGaN LED 700 and a minimum spacing between the said components. With reference to FIG. 10, the components of the InGaN LED 700 include a bondpad (which is a landing pad to facilitate external electrical probing of the InGaN LED 700), the p-contact 718, the n-contact 720a, 720b, at least one multi-quantum-well (i.e. the InGaN/GaN MQWs 708), and a mesa (i.e. device-to-device separation). It is also to be appreciated that data for the layout design rules are obtained from consideration of required device requirements, material system and process constraints of the method of FIG. 1. The definition of "material system" herein may include choice of materials to use for forming a LED/photodetector, and materials to use for forming an associated waveguide. This affects (or is conversely driven by) a desired light wavelength to be deployed for (or by) the LED/photodetector of interest. To further clarify, a "material system" choice may also mean selecting, for example, between InGaN/GaN (if light of a wavelength of 450 nm is to be used), or InGaAs/GaAs (if light of a wavelength of 1 μm is to be used) to be used for forming the LED/photodetector.

Figure 11A:
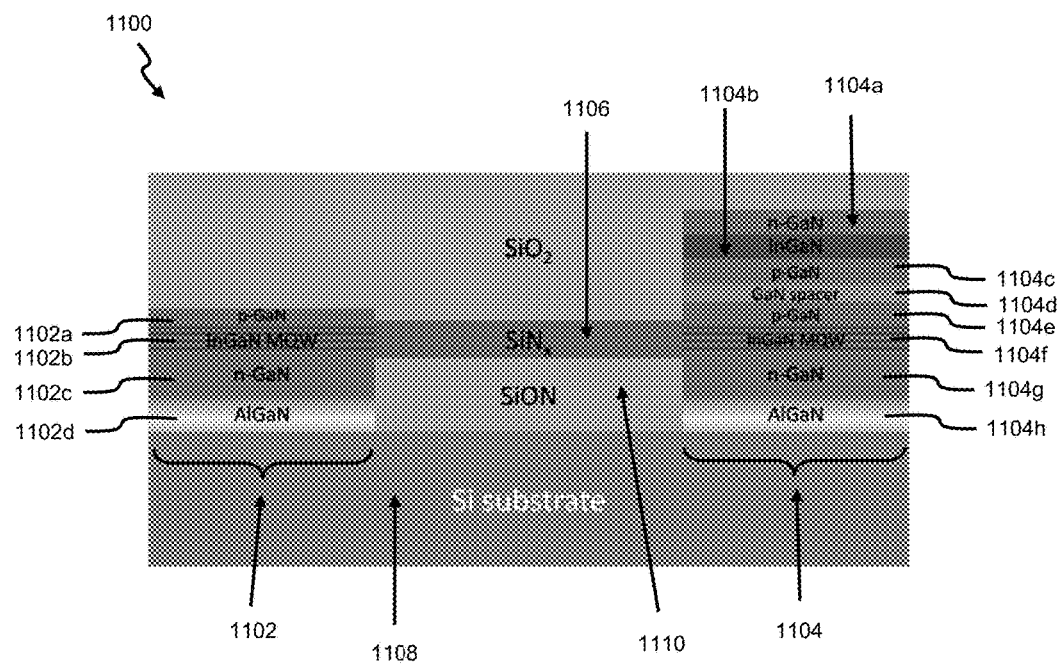
Figure 11B:
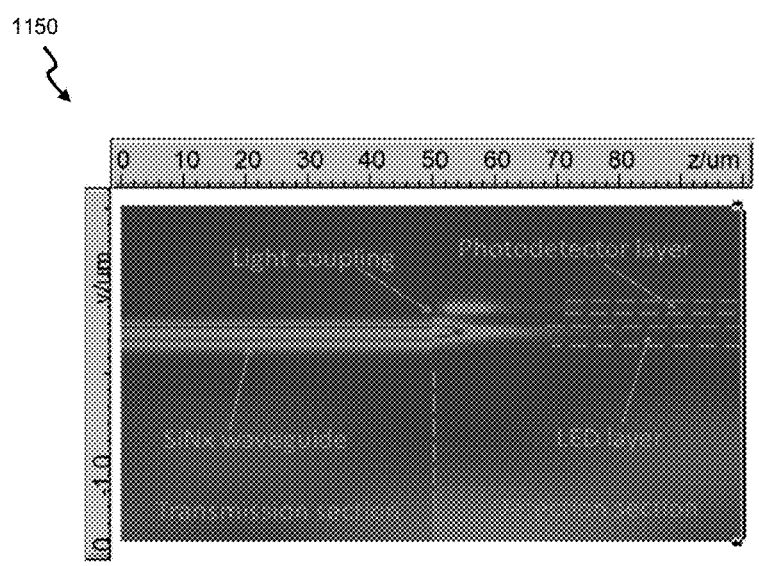
FIG. 11B shows optical field transmission and coupling loss performance of the integrated circuit of FIG. 11A.

FIG. 11A is a second example 1100 of the integrated circuit formed using the method of FIG. 1, while FIG. 11B shows a diagram 1150 of optical field transmission and coupling loss performance of the second example 1100 of FIG. 11A. For the second example 1100, the integrated circuit is formed to comprise an InGaN/GaN LED 1102 and the InGaN/GaN photo-detector 1104, which are coupled together by a waveguide 1106. The InGaN/GaN LED 1102 and InGaN/GaN photo-detector 1104 are formed on top of a Si substrate 1108, as will be understood by now. Specifically, the InGaN/GaN LED 1102 includes (in a top down order) a p-GaN layer 1102a, an InGaN MQW layer 1102b, an n-GaN layer 1102c, and an AlGaN layer 1102d. The InGaN/GaN photo-detector 1104 includes (in a top down order) a first n-GaN layer 1104a, a InGaN layer 1104b, a first p-GaN layer 1104c, a GaN spacer layer 1104d, a second p-GaN layer 1104e, an InGaN MQW layer 1104f, a second n-GaN layer 1104g and an AlGaN layer 1104h. The different layers of the InGaN/GaN LED 1102 and InGaN/GaN photo-detector 1104 are formed in a similar manner as afore described in FIG. 3A, and hence not repeated.

Compared to FIG. 6B, where the InGaN LED 604 and InGaN photodetector 606 are each identically formed, the InGaN/GaN LED 1102 and InGaN/GaN photo-detector 1104 of the second example 1100 formed with slightly different structures, although sharing common layers at the bottom of the device stack. Specifically, the common layers are that the p-GaN layer 1102a, InGaN MQW layer 1102b, n-GaN layer 1102c, and AlGaN layer 1102d (all of the InGaN/GaN LED 1102) respectively correspond to the second p-GaN layer 1104e, InGaN MQW layer 1104f, second n-GaN layer 1104g and AlGaN layer 1104h (all of the InGaN/GaN photo-detector 1104). It is to be appreciated that forming the InGaN/GaN LED 1102 and InGaN/GaN photo-detector 1104 with different structures have certain benefits and drawbacks. For example, with respect to the InGaN/GaN photo-detector 1104, a benefit with arranging the InGaN layer 1104b to be on top of (and separated by a few layers 1104c-1104e from) the InGaN MQW layer 1104f results in better absorption at the LED MQW emitting wavelengths, but a drawback is that the growth process and fabrication process however becomes more complicated. In other embodiments, with selective-area regrowth as mentioned above, it is also possible to selectively grow one or both sides (of the LED and/or photodetector) so that each optoelectronic device may be formed with a different structure.

Separately, $SiN_x$ is adopted as a material used to form the waveguide 1106 to facilitate transmission of light of visible wavelength emitted by the InGaN/GaN LED 1102. The waveguide 1106 is integrated with the InGaN/GaN LED 1102 and InGaN/GaN photo-detector 1104 using the Damascene process. For operating the InGaN/GaN LED 1102 using a light wavelength of about 400 nm to 500 nm, typical propagation loss of the waveguide 1106 is lower than 1 dB/cm. SiON is utilized as an optical isolation layer 1110 arranged intermediate the waveguide 1106 and the Si substrate 1108. The tunable refractive index of SiON also provides a flexible design dimension. Simulations show that if the waveguide 1106 is configured with a length of 500 nm and a core size of 200 nm (with SiON n=1.8 and SiO2 used as upper cladding), it only supports fundamental TE and TM modes with high confinement factors (i.e. greater than 80%).

Coupling loss performance between the InGaN/GaN LED 1102, waveguide 1106, and InGaN/GaN photo-detector 1104 is evaluated to be less than 1 dB. With reference to FIG. 11B, after the emitted light enters the InGaN/GaN photo-detector 1104, the light first propagates a small distance in the underneath light-emitting layer (i.e. the InGaN MQW layer 1104*f*) and then couples into the upper photo-detector layer (i.e. the InGaN layer 1104*b*). It is to be appreciated that the Indium composition shift in the upper photo-detector layer (i.e. the InGaN layer 1104*b*) and light-emitting layer (i.e. the InGaN MQW layer 1104*f*) also enhances the light detection efficiency. In this respect, initial evaluation indicates a responsivity of about between 0.03 to 0.3 A/W is achievable at a light wavelength of about 450 nm.

The remaining configurations will be described hereinafter. For the sake of brevity, description of like elements, functionalities and operations that are common between the different configurations are not repeated; reference will instead be made to similar parts of the relevant configuration(s).

It is to be appreciated that conventional designs of photonic Network-on-Chips (NoCs) typically use lasers as light emitting sources and microring resonators as modulators, detectors and routers. Particularly, the conventional photonic NoCs are configured to leverage multiple wavelengths with associated filters, and also arranged with NoC architectures such as buses and token rings which enable one-to-many connections. But unlike the conventional designs, since LED (used in the proposed integrated circuit) is an incoherent light source, and that LED-based circuits are unable to use resonant devices, NoC architectures that allow multiplexing of multiple flows atop of one-to-one connection at ultra-low power are instead adopted in order to fit deployment of the proposed integrated circuit. For example, an NoC with mesh-topology commonly used in modern many-core processors is adoptable to replace one-to-one electrical metal-based interconnects (that link neighbouring cores) with respective LED-based optical interconnects as provided in step 104 of the proposed method of FIG. 1. Furthermore, it is to be appreciated that conventional electrical routers at each core of the processor are able to readily handle arbitration of multiple flows onto the one-to-one links. But this however leads to a high electrical energy overhead, with the Optical-Electrical-Optical conversion and electrical buffering/switching at each en-routing electrical router, which undesirably reduce benefits of using the LED-based optical interconnects of the proposed integrated circuit for long distance cross-die communications.

Figures 12A, 12B:
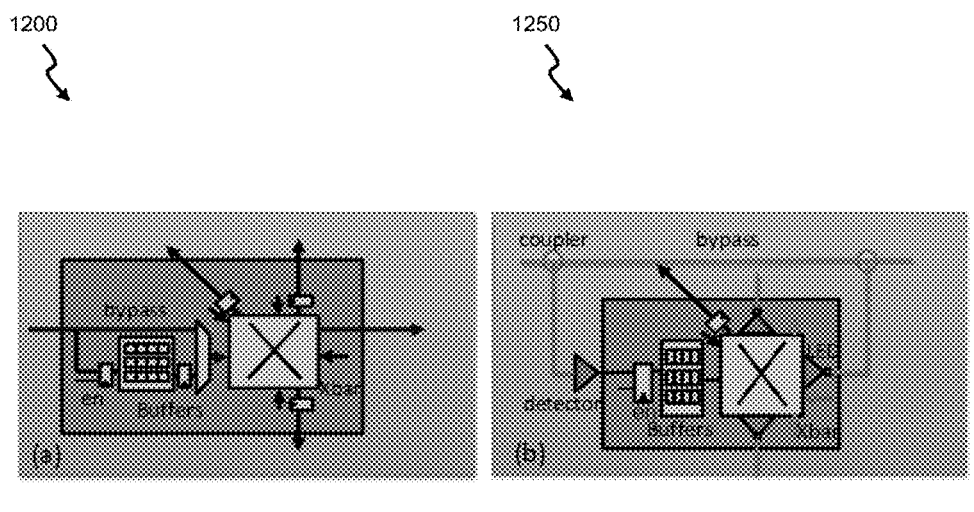

In this further embodiment, a variant based on the NoC architecture known as Single-cycle Multi-hop Asynchronous Repeated Traversal (SMART) 1200 as depicted in FIG. 12a, which was originally proposed in literature for electrical clock-less repeated links to realize a single-cycle data path across the entire die (i.e. entirely from the source to destination), is adopted. As a background, the SMART micro-architecture 1200 allows messages to dynamically arbitrate and create multi-hop bypass links across the chip on-demand over a shared network fabric. Messages are only buffered at intermediate routers upon contention. By bypassing intermediate electrical routers, a message is allowed to transverse from source to destination electrical routers, avoiding high-energy overheads of intermediate electrical routers in most cases. Originally proposed as a solution to break the latency barrier for NoCs, the SMART micro-architecture 1200 however still consumes 28-32 fJ/bit/mm, leading to worst case transmission energy of 600 fJ to transmit a bit from one chip edge to another chip edge on a typical 20 mm by 20 mm dimensioned chip.

Accordingly, potential of adopting the proposed LED-based optical interconnects (as provided through step 104 of the method of FIG. 1) into the SMART micro-architecture 1200 to further break the power barrier of on-chip communications is envisaged in this embodiment. In this respect, FIG. 12B shows a variant SMART micro-architecture 1250 (based upon the SMART micro-architecture 1200), in which the bypass links of the SMART micro-architecture 1200 are now is replaced with the said LED-based optical interconnects (as enabled by the method of FIG. 1). This SMART micro-architecture 1250 beneficially allows distance-independent low-power transmission of photonics to be leveraged. Besides, the method of FIG. 1 also advantageously enables the LED-based optical interconnects to be closely integrated with the Si-CMOS routers and processors.

Figure 13A:
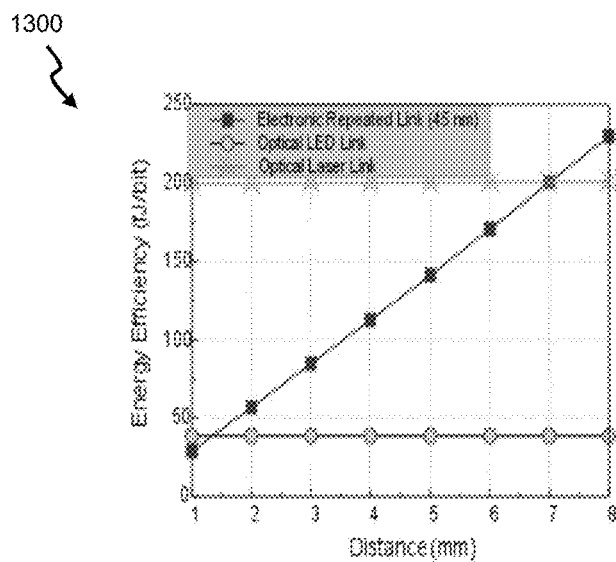
FIG. 13A is graph of energy efficiency performance between conventional solutions and the integrated circuit formed using the method of FIG. 1.

For comparison, energy efficiencies of the proposed LED-based optical interconnect against a baseline electronic clock-less repeated interconnect in a 45 nm node, and a laser-enabled optical interconnect are then evaluated (i.e. all modelled at an operating frequency of 1 GHz) using DSENT (i.e. a timing-driven NoC power-modeling software), and the corresponding performance results are shown in a graph 1300 in FIG. 13A. Specifically, the laser-enabled optical interconnect is modelled to constitute an off-chip laser, a microring modulator, receivers and peripheral electrical devices. An electrical LED model is used to estimate the Si-driver size in DSENT. Particularly, the effective capacitance of the LED (i.e. about 6.3 fF) and parasitic capacitance of the vias (i.e. about 1.7 fF) are used to size the Si-driver and its associated power consumption. In addition, waveguide loss is set to be 1 dB/cm and responsivity for the photodetector is set to 1 A/W for a Ge detector, or 0.3 A/W for an InGaN detector. Within short distances relating to a length of the associated interconnect (i.e. less than 8 mm), most operating powers are consumed by the electrical driving and leakage in the optical interconnect. Therefore, it is shown in FIG. 13A that energy consumption for the electronic interconnect increases linearly while the LED-based optical interconnect/laser-enabled optical interconnect remains almost constant regardless of transmitting distance. It will clearly be seen from FIG. 13A that with a power efficiency of 38 fJ/b, the proposed LED-based optical interconnect thus easily outperforms the electronic interconnect/laser-enabled optical interconnect.

Figure 13B:
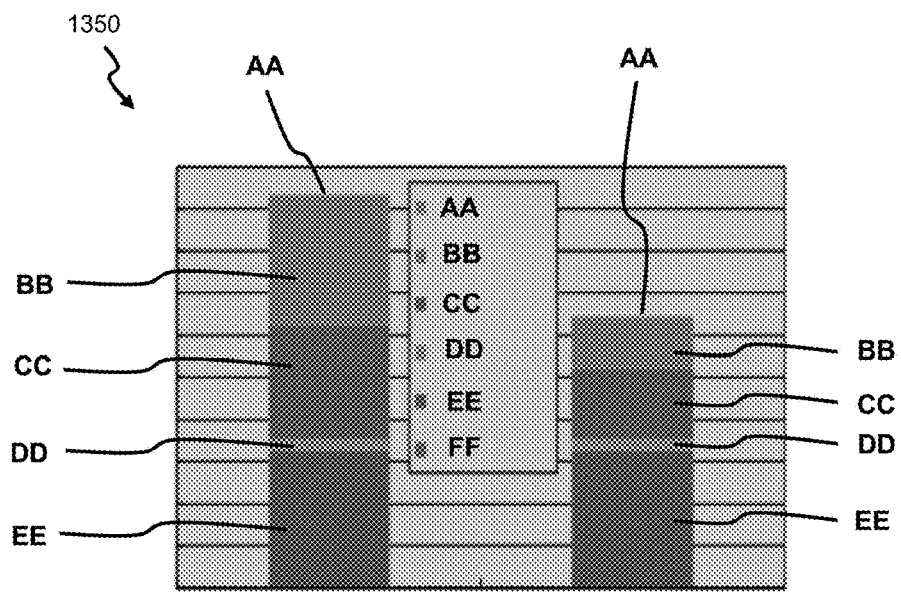
FIG. 13B is a graph of normalized dynamic network energy performance between the SMART micro-architecture of FIG. 12A and the variant SMART micro-architecture of FIG. 12B.

FIG. 13B is a graph 1350 comparing normalized dynamic network energy performance between the SMART micro-architecture 1200 and variant SMART micro-architecture 1250 using SPLASH-2 applications on a 64-core processor. Specifically, parallel sections of all 64-threaded SPLASH-2 applications are executed on an 8×8 multicore processor with shared L2 cache, and the multiple applications' results are then averaged. Two electrical NoC baselines are used: a state-of-the-art NoC with a single-cycle-pipeline router and a NoC based on the SMART micro-architecture 1200. All results are normalized against the single-cycle router. It is to be appreciated that both electrical NoC baselines are highly optimized, outperforming recent industry chip prototypes such as the Intel 48-core SCC with a 3-cycle router in latency and energy. Performance-wise, the SMART micro-architecture 1200 delivers five-to-eight times lower latency than the single-cycle router electrical baseline, whereas the variant SMART micro-architecture 1250 is able to maintain the performance advantages as depicted in FIG. 13B. The SMART micro-architecture 1200 has a slight energy advantage over the baseline single-cycle router due to savings in buffering at intermediate routers, while the variant SMART micro-architecture 1250 substantially reduces link and crossbar dynamic energy consumption by a substantial 68% and 37% respectively, therefore leading to overall energy savings of about 28% over the SMART micro-architecture 1200, across all applications.

In summary, with increasing market demand for power efficient on-die communication that scales with upcoming multicore processors, the proposed method of FIG. 1 enables an integrated circuit with LED-based optical interconnects that meet the objective. Particularly the proposed method uses a monolithic integrated process for bonding an III-V substrate and a silicon substrate, which beneficially is directly compatible with conventional CMOS processing. This thus requires no costly and complex reconfiguration of existing CMOS manufacturing techniques, and will enable easy integration with the CMOS manufacturing techniques to facilitate mass production. For the proposed method, an on-wafer integration technique is specifically devised whereby the transistors 200 are CMOS manufactured and the optoelectronic devices 300 are formed as III-V semiconductors. So using the proposed method of FIG. 1, LED-based optical interconnects are formable, in which each LED-based optical interconnect includes at least a directly modulated, high speed LED (which may be formed using III-nitride), and a corresponding photodetector, which are collectively coupled by an intermediate waveguide. For information sake, it is to be appreciated that LEDs formed using nitride-based materials (being of the III-V family of materials) are more reliable and practical than being formed using other III-V materials. It is to be appreciated that multicore processors (with on-chip networks that link the different cores) may thus be enabled with the proposed LED-based optical interconnects for the on-chip networks to have substantially lower energy consumption, higher bandwidth density, smaller area footprint, and improved performance than conventional electrical-interconnects based designs. In addition, while heating effects may be more prominent for the LED-based optical interconnects since efficient heat dissipation is more challenging in the small-sized LEDs, this heating issue may however be easily addressed via improved packaging of the optoelectronic devices 300.

Broadly, the integrated circuit includes at least one transistor 200 arranged in a partially processed CMOS substrate; and at least a pair of optoelectronic devices 300 adapted to be coupled by a waveguide, which are collectively arranged on a semiconductor substrate. The semiconductor substrate is arranged adjacent to the partially processed CMOS substrate. The optoelectronic devices are also electrically connected to the transistor, and the optoelectronic devices are formed from a wafer material different to silicon.

Additionally, the proposed method of FIG. 1 is beneficially able to address the following problems faced by conventional solutions.

Problem 1

It is challenging to realize a wide variety of photonic devices, including high speed LEDs and detectors, and visible light transparent waveguides within a converged process platform. Silicon is typically considered as a future platform of choice for building optoelectronic devices, being able to accommodate both Si-CMOS transistors as well as integrated photonics. However, since silicon has an indirect bandgap that undesirably provides weak interaction between mobile charge carriers and photons, there is thus a hurdle to fabricate active photonic devices (e.g. LEDs) using silicon.

Solution to Problem 1

As III-V materials are particularly suitable for manufacturing optoelectronic devices, the proposed method of FIG. 1 is devised to enable on-chip LED-based optical interconnects as described in step 104 of FIG. 1, whereby electrical transistors are formed via CMOS processing while the optoelectronic devices are formed from III-V materials (i.e. see FIGS. 1-5D).

Problem 2

Conventional solutions for enabling on-chip optical interconnects tend to rely on utilising off-chip lasers as the light emitting sources, but there are disadvantages with such an approach. Firstly, lasers consume a significant amount of power due to their high threshold current; even when the connections are used sporadically, power consumption of the lasers remains constant as communication data is modulated externally atop of the continuous wavelengths, resulting in high laser power consumption regardless of actual data transmission through the optical interconnects. Secondly, external modulators require drivers with several amplification stages that consume large amount of driving power especially for high data rate modulation with stringent driving requirements. Furthermore, the insertion loss (which is typically greater than 5 dB) of a modulator worsens the optical power budget, thus requiring even greater output power from the lasers.

Solution to Problem 2

With the proposed method, an alternative light emitting source for on-chip optical interconnects is envisaged: directly modulated LEDs. Firstly, LED functions as a reliable light emitting source that switches on without a threshold current. Particularly, when an operation voltage of a LED is above a minimum threshold value termed as the turn-on-voltage (ToV), the current flow and light output consequently increase exponentially with voltage. Below the ToV value, the LED is switched off and negligible current conducts through the LED, thus consuming and dissipating minimal power. Secondly, substantial power consumption savings may also be achieved by using LEDs in the on-chip optical interconnects since external modulators are no longer needed.

Problem 3

InGaN/GaN MQWs LED structures are generally used as a solid-state light source. However, LEDs with afore said structures are normally designed for use in interior house lightings. For on-chip communications, it is typically desirable to have as high a modulation bandwidth as possible. But it is to be appreciated that LEDs configured with relatively lower modulation bandwidth, even if lower than 1 Gb/s, are still highly useful for on-chip communications. As a comparison, modern telecommunications lasers typically have bandwidths greater than 40 Gb/s.

Solution to Problem 3

Bandwidth limitation is fundamentally determined by the spontaneous radiative recombination lifetime of injected electrons or holes, presumably in the nano-second range. However, recent successes (documented in literature) of driving LEDs to high frequencies have been achieved either by increasing the active layer concentration of electrons and holes, or by improving the bimolecular recombination. Accordingly based on the proposed method of FIG. 1, integrated InGaN MQW micro-size LEDs for on-chip communication is realisable and feasible. For example, the frequency response of a 10 μm by 10 μm LED, evaluated through simulations, is determined to achieve more than 5 GHz. Also, the higher 3-dB bandwidth for an LED with reduced size may be explained by the enhanced radiative recombination rate in smaller LEDs, which is in good agreement with experimental measurements made for an individual microdisk blue LED with diameter of 5 μm (based on literature).

Problem 4

There is a problem of how to easily and cheaply integrate (silicon-based) transistors and optoelectronic devices together with existing known solutions.

Solution to Problem 4

Using the proposed method of FIG. 1, the InGaN/GaN photodetector and InGaN/GaN LED may be manufactured via a single epitaxial growth process to enable light detection and emission for the LED-based optical interconnect. Efficient light coupling between the light-emitting and absorption layers (e.g. see the InGaN layer 1104b and InGaN MQW layer 1104f respectively of FIG. 11A) ensures highly-efficient detection with low loss in the underlying light-emitting layer (e.g. the InGaN MQW layer 1104f of FIG. 11A). The absorption layer is another term for the photo-detector layer. Through performance simulations, it has been determined that the InGaN/GaN photodetector integrated with a waveguide (e.g. made of $SiN_x$) has a higher responsivity than a normal-incidence detector because the light propagation distance in the absorption layer (e.g. the InGaN layer 1104b of FIG. 11A) is much longer. The high responsivity indicates that lesser light power is required to enable signal receipt and therefore is able to reduce the system's power-budget. The low-loss waveguide (i.e. with a loss of less than 1 dB/cm operating under light wavelengths of 400 nm to 500 nm), and low coupling loss (i.e. less than 1 dB) between active and passive devices are important to guarantee the low-power operation of the optical interconnect (as enabled using our proposed method).

Problem 5

It is well-established that the power consumed by electrical interconnects relates to capacitance of the electrical interconnects, supply voltage and clock frequency. Since the capacitance increases with length of the interconnect and configured clock frequency (which affects the bandwidth of the interconnect), the power consumption of an electrical interconnect grows with distance and bandwidth. Moreover, in order to improve the interconnect latency, long wires are routinely segmented into smaller sections, with repeaters incorporated in between, increasing total wire coupling capacitance and thus the power consumption of the interconnect. Even with aggressive designing, an electrical interconnect generally still consumes about 28-32 fJ/bit/mm, leading to a worst case transmission energy of 600 fJ to transmit a data-bit from one chip edge to another chip edge on a typical 20 mm by 20 mm dimensioned chip.

Solution to Problem 5

Using the proposed method of FIG. 1, LED-enabled optical interconnects are integrated with the CMOS transistors (which are electrically based) to improve the power efficiency of on-chip communications. Specifically, the proposed method enables the LED-enabled optical interconnects to be closely integrated with the CMOS transistors. As depicted in FIGS. 2A-2C and 3A-3D, the CMOS transistors are fabricated on the Si-CMOS substrate 202, while the optoelectronics devices and waveguides are processed on the III-V substrate 302. Also, as discussed, FIG. 12B shows the variant SMART micro-architecture 1250, which is adapted to utilise the LED-based optical interconnects (as enabled by the proposed method). Specifically, the bypass links are replaced with the optical interconnects comprising LEDs, waveguides and couplers to beneficially leverage upon the distance-independent low-power transmission characteristics provided by photonics data communication.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

For example, it is possible that for the integrated circuit, not all interconnects are formed as the LED-based optical interconnects. That is, there is a flexibility of forming some interconnects as conventional electrical interconnects, while other interconnects are then formed as LED-based optical interconnects in accordance with step 106 of the method of FIG. 1. Also, other III-V materials that are usable for the method of FIG. 1 include InGaP (to accommodate wavelengths in the red colour region), or GaAs/AlGaAs/InGaAs (to accommodate wavelengths in the near-infrared region, i.e. 850 nm, 1310 nm, 1550 nm), depending on requirements. It is also to be appreciated that the LED-based optical interconnect is bi-directional in nature: the LED and corresponding photodetector are equivalent devices, merely operated under different biasing conditions. Moreover, it is to be appreciated that the above may be true for the schematics shown in FIG. 6, but for FIG. 11A, it may not be due to difference in structures between the InGaN/GaN LED 1102 and InGaN/GaN photo-detector 1104. Nevertheless, the InGaN/GaN LED 1102 and InGaN/GaN photo-detector 1104 may theoretically still be operated bi-directionally, though with different link performances in each direction. Furthermore, each LED-based optical interconnect is not limited to as being formed as a one-to-one (i.e. point-to-point) link; the LED-based optical interconnect may in fact be formed as a one-to-many link, a many-to-one link or a many-to-many link (although the latter two types of links may require utilisation of time-multiplexing techniques). In addition, if OLEDs, instead of LEDs, are formed as the optoelectronic devices 300, then suitable organic materials are used over the III-V substrate 302. Yet further, it is also possible to use selective-area regrowth to form desired device mesas on top of the III-V substrate 302, prior to performing step 1042 of FIG. 3A. Based on a variation, FIG. 14 is a table 1400 listing various example design parameters for components of the InGaN LED 700. As will be appreciated, the design parameters in FIG. 14 substantially improve upon those parameters as afore described for the table 1000 of FIG. 10.

The invention claimed is:

1. An integrated circuit comprising:
   at least one transistor arranged in a partially processed CMOS device layer; and
   at least a pair of optoelectronic devices adapted to be coupled by a waveguide to define an optical interconnect on a semiconductor substrate which is arranged adjacent to the partially processed CMOS device layer,
   wherein the optoelectronic devices are configured to be electrically connected to the at least one transistor through at least one via formed in the partially processed CMOS device layer and the semiconductor substrate, and the optoelectronic devices are formed from at least a first wafer material different to silicon, and
   wherein the waveguide is formed from a second wafer material deposited in a first recess formed in the first wafer material.

2. The integrated circuit of claim 1, wherein the first wafer material different to silicon includes a group III-V semiconductor material or an organic material.

3. The integrated circuit of claim 2, wherein the group III-V semiconductor material includes GaN, InGaP, GaAs, AlGaAs or InGaAs.

4. The integrated circuit of claim 1, wherein the integrated circuit is formed as a single processor or a portion of a processor.

5. The integrated circuit of claim 1, wherein the optical interconnect is arranged below the partially processed CMOS device layer.

6. The integrated circuit of claim 1, wherein the second wafer material includes silicon nitride.

7. The integrated circuit of claim 1, wherein the optoelectronic devices have different structures, and
    wherein one of the optoelectronic devices includes an InGaN layer on top of and separated from an InGaN MQW layer.

8. The integrated circuit of claim 1, wherein the at least one transistor comprises a first transistor and a second transistor configured to communicate with one another through the optical interconnect.

\* \* \* \* \*